United States Patent [19]
Donahoe et al.

[11] Patent Number: 5,808,869
[45] Date of Patent: Sep. 15, 1998

[54] METHOD AND APPARATUS FOR TRANSFERRING HEAT FROM A PCMCIA CARD

[75] Inventors: Daniel Noel Donahoe, Spring; Edward Joseph Brod, Houston, both of Tex.

[73] Assignee: Compaq Computer Corporation, Houston, Tex.

[21] Appl. No.: 735,322

[22] Filed: Oct. 22, 1996

[51] Int. Cl.[6] .................................................. H05H 7/20
[52] U.S. Cl. ........................ 361/704; 174/15.2; 361/700; 361/715
[58] Field of Search .......................... 174/15.2; 361/687, 361/690, 699, 700, 704, 707, 715–716, 717–722, 728, 730, 752, 737

[56] References Cited

U.S. PATENT DOCUMENTS

| | | | |
|---|---|---|---|
| 5,037,313 | 8/1991 | Linden et al. | 361/690 |
| 5,475,563 | 12/1995 | Donahoe et al. | 361/695 |
| 5,526,229 | 6/1996 | Wakabayashi et al. | 361/702 |

FOREIGN PATENT DOCUMENTS

| | | | |
|---|---|---|---|
| 3504079 | 8/1986 | Germany | 361/720 |
| 3736271 | 5/1989 | Germany | 361/720 |

*Primary Examiner*—Gregory D. Thompson
*Attorney, Agent, or Firm*—Fish & Richardson, P.C.

[57] ABSTRACT

A method and apparatus for transferring heat from a PCMCIA card involves the use of an external heat transfer device for transferring heat from the PCMCIA card located inside a computer to the environment surrounding the computer housing. Heat may be transferred from the interior of the PCMCIA card to temporary heat sinks inside the card. An external heat transfer device may be connectable for heat transfer to the exterior. The heat transfer device may be releasably pluggable onto and unpluggable from the PCMCIA card.

8 Claims, 3 Drawing Sheets

METHOD AND APPARATUS FOR TRANSFERRING HEAT FROM A PCMCIA CARD

FIELD OF THE INVENTION

This invention relates generally to PCMCIA cards and computer systems using such cards and more particularly to techniques for removing heat generated by those cards when in use inside personal computers.

BACKGROUND ART

Computer expansion cards compliant with standards promulgated by the Personal Computer Memory Cards International Association are commonly known as PCMCIA cards. PCMCIA cards are becoming increasingly popular with personal computer users since they enable the personal computer users to effectively custom design their own computer systems. These cards implement user selectable enhancements such as modems, expanded memories, networks, facsimiles or other capabilities. Because a personal computer owner may purchase only the desired cards to augment a basic computer, it is not necessary to buy hardware to implement a variety of general functions which the user may not need.

While PCMCIA cards may be used on other personal computers, they have found particular applicability in notebook, laptop or subnotebook computers because of the small size of those computers. Notebook computers may have one or two PCMCIA slots usually positioned one above the other. A card may be positioned in a slot to provide an additional capability for the computer.

The conventional PCMCIA card has a connector on one end which connects to a printed circuit board within the card. That board may have a plurality of integrated circuit components mounted thereon. As with any electrical device, PCMCIA cards generate heat. For a number of reasons, including reliability issues, it is desirable to prevent overheating of these cards. However, the heat transfer characteristics of conventional PCMCIA cards are generally less than ideal. A thin housing traps a small airspace. This arrangement does not optimize heat transfer from the components on the printed circuit board.

In notebook computers, the heat transfer characteristics of the card and the interior of the personal computer system are particularly adverse. Because of the dense packing inside notebook computers, there is relatively little airspace to facilitate heat transfer. Also, because of the higher packing density, the temperature inside the housing may be higher than in other computers. Thus, the transfer of heat from the card to the internal environment of the computer is less than ideal.

The removal of heat from PCMCIA cards is complicated by the operating characteristics of these cards. For instance, the cards need to be able to slide into and out of the computer. This complicates conductive transfer of heat from the card to a heat transfer device. One technique for removing heat from PCMCIA cards is disclosed in U.S. Pat. No. 5,475,563 issued to Donahoe, et al. This patent discloses inter alia the use of a fan system inside the computer to blow air over a heat transfer plate in contact with the card. The plate is spring biased against the PCMCIA card to enable conduction from the card to the plate. The plate is then cooled by air flow over the plate. While this approach has many advantages, it may involve more cost than some computer users would prefer to incur and in some instances it may involve special adaptation of the computer. This means either that the computer must be so adapted at the factory or that subsequent adaptation must be made to facilitate the heat transfer. Some users may not be willing to bear the added cost, other users may not be interested in having their computers adapted to this function, and still others may have computers which are not amenable to such adaptation.

Therefore, it would be highly desirable to have a technique for removing heat from the PCMCIA cards which does not necessitate any adaptation of the computer itself. In addition, it would be desirable to have a system for removing the heat which is extremely flexible and economical.

SUMMARY OF THE INVENTION

The present invention relates to PCMCIA cards which are conventionally pluggable into a personal computer. These cards include a housing with an inner end that is inserted into the computer and an outer end opposed to the inner end. A printed circuit board is mounted in the card housing for electrical connection to the computer. A heat transfer device is connectable to the outer end of the card to transfer heat from the card to the exterior of the card and computer.

In one embodiment of such a card, the heat transfer device is releasably pluggable into the card and releasably unpluggable from the card. The heat transfer device may be adapted to permit multiple cards to be plugged into multiple PCMCIA slots without interference between the various heat transfer devices. In addition, the heat transfer devices may be adapted to permit electrical connection through the heat transfer device.

In still other embodiments, heat transfer from the card to the exterior of the card and the computer may be facilitated by providing a heat transfer path of low heat transfer resistance. The heat transfer device may have an extension that plugs into the PCMCIA card and contacts a heat sink inside the card. In this way, the low resistance heat path can conduct heat from the interior of the card into the heat transfer device for dissipation to the environment around the computer.

In other embodiments, the heat transfer device may be snap connectable to the PCMCIA card for easy attachment and removal. For example, the user may purchase one single heat transfer device which may be used on a variety of cards when needed.

In accordance with still another aspect of the present invention, a method for removing heat from a PCMCIA card involves plugging a heat transfer device into a card. The heat transfer device then extends to the exterior of the card and the computer. As a result, heat transfer proceeds from the card to the heat transfer device to the ambient environment outside the computer.

DESCRIPTION OF A PREFERRED EMBODIMENT

Figure 1:
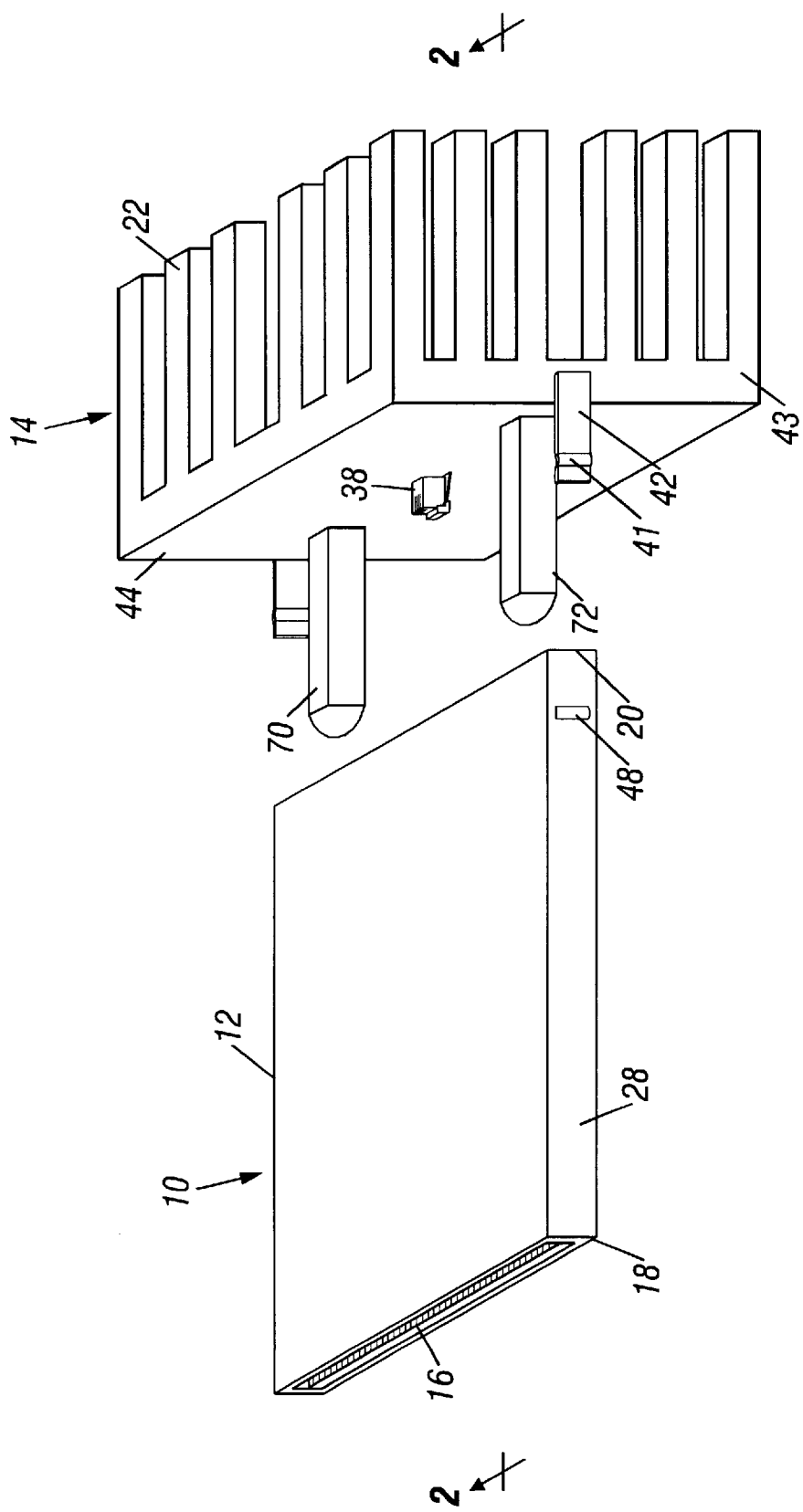
FIG. 1 is a perspective view of one embodiment of a PCMCIA card with a heat transfer device detached from the card.
Figure 2:
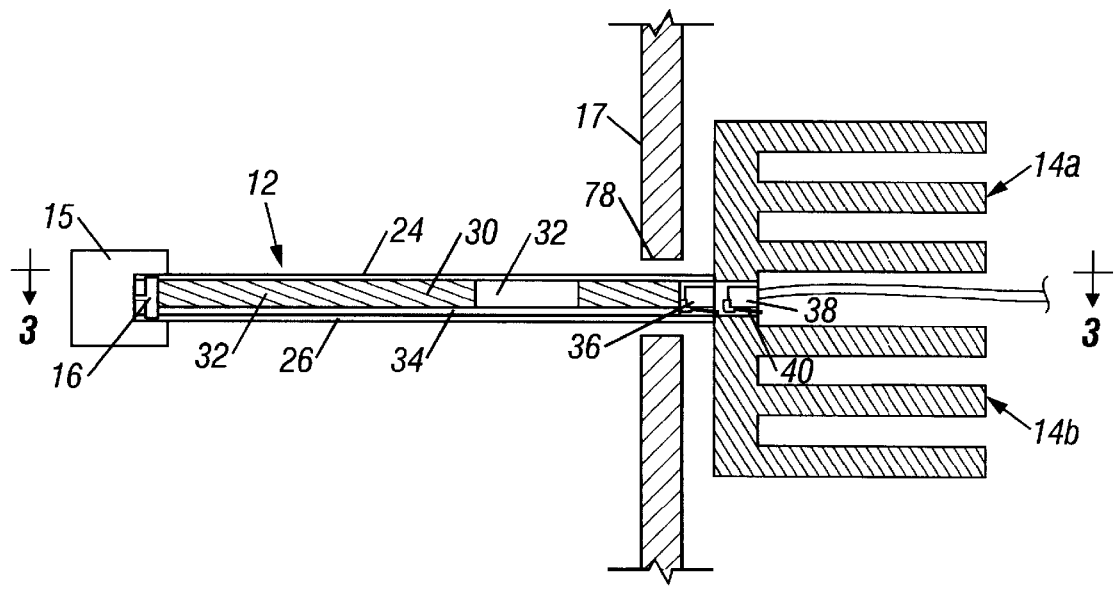
FIG. 2 is a cross-sectional view taken generally along the line 2—2 in FIG. 1 but showing the card inside a partially depicted computer.

Referring to the drawing wherein like reference characters are used for like parts throughout the several views, a PCMCIA card 10, shown in FIG. 1, includes a housing 12 and a heat transfer device 14. The housing 12 may include a connector 16 of conventional design to permit electrical connection of the card 10 to an interiorly located connector 15 of a personal computer 17, as shown in FIG. 2. The housing has an inner end 18 punctuated by the connector 16 and an outer end 20 connectable to the heat transfer device 14.

The heat transfer device 14 may take a variety of conventional forms. The device 14 is advantageously a heat sink of the smallest feasible size and implements the highest feasible rate of heat transfer. In the embodiment illustrated in FIG. 1, the heat transfer device 14 includes a plurality of fins 22 which increase the heat transfer area and thereby augment the rate of heat transfer. The device 14 is advantageously made of a lightweight material with a high heat transfer coefficient, such as aluminum. However, any conventional heat transfer device may be utilized in connection with the present invention. In addition, the heat transfer device 14 may include a fan to augment the heat transfer.

The heat transfer device 14 may be releasably pluggable into the housing 12 for use and unplugged from the housing 12 when not in use. This enables the heat transfer device 14 to be used with a variety of housings 12 without requiring the user to purchase heat transfer devices 14 for each PCMCIA card the user may own.

The housing 12 may include an upper cover 24 and a lower cover 26 connected by an edge cover 28, as shown in FIG. 2. While conventionally the upper and lower covers 24 and 26 are made of a very thin metallic material, the inventors of the present invention appreciated that it would be advantageous to make the covers 24 and 26 as thick as possible so that they act as heat transfer sinks for efficient removal of heat from housing 12. In addition, it would be desirable to minimize the airspace inside the housing 12. Therefore, in addition to making the upper and lower covers 24 and 26 as thick as possible, the remaining interior space can be filled with a filler 30 which displaces additional air and improves heat transfer. The filler 30 may be constructed of a metal plate slotted to receive the electrical components 32 which are mounted on the printed circuit board 34. Other techniques for providing the filler 30 include incorporating a potting material; however, it is advantageous to use a material such as aluminum which has a good rate of heat transfer. The upper and lower covers 24 and 26 may touch the top of the electrical components 32 which can be, for example, integrated circuits which are electrically connected to the printed circuit board 34.

The printed circuit board 34 electrically connects to the connector 16 to provide for eventual electrical connection to a mating connector 15 inside a personal computer 17. The housing 12 may also have a connector 36 on its outer end 20 for electrical connection to other components on the exterior of the computer. For example, in a PCMCIA card 10 adapted for use as a modem, it may be desirable to make connection to an exterior telephone line. This may be accomplished by plugging the connector 36 into a mating connector 40 mounted inside the heat transfer device 14. The connector 40 inside the heat transfer device 14 then makes electrical connection to a connector 38 of conventional design. In this way the connector 40 acts as a connector through the heat transfer device to the exterior device.

Figure 3:
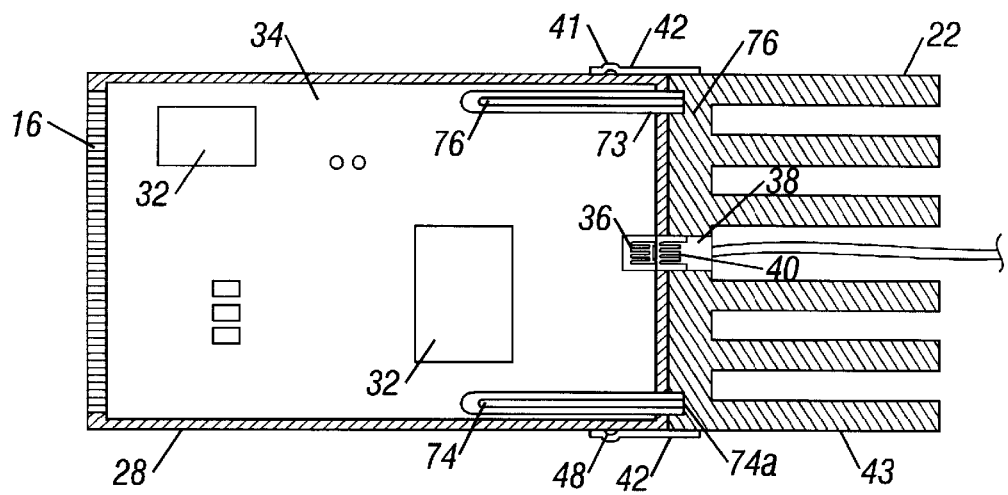
FIG. 3 is a cross-sectional view taken generally along the line 3—3 in FIG. 2.

Advantageously, the heat transfer device 14 is releasably and pluggably connectable to and disconnectable from the housing 14. One embodiment for implementing this type of connection shown in FIGS. 1 and 3, includes a spring catch 42 which extends outwardly from the each side face 43 of the heat transfer device 14. In the illustrated embodiment, a pair of leaf spring catches 42 extend outwardly from opposed side faces 43 and engage the edge cover 28. Each catch 42 may include a mating portion 41 that snaps over and is held on a knob 48 formed on each edge cover 28. In this way, the heat transfer device 14 may be plugged onto the housing 12 and latched to the housing 12 so that it may be releasably unplugged from the housing 12 when desired. In the situation where connectors 38 and 40 are used, the heat transfer device 14 similarly unplugs from the connector 38 in the same operation.

Any conventional technique may be used to secure the device 14 to the housing 12. For example, a variety of latches or detents may be used, including frictional securement means.

A variety of techniques may be utilized to transfer heat from the housing 12 to the heat transfer device 14. For example, through the provision of thicker upper and lower covers 24 and 26 and filler 30, heat may be transferred by conduction to the heat transfer device 14. In this way, the covers 24 and 26 and filler 30 act as intermediate heat sinks to collect the heat and transfer it out of the computer.

One technique for removing heat from the housing 12 uses a pair of bullet shaped rails 70 and 72 which extend outwardly from the flat face 44 of the heat transfer device 14, as shown in FIG. 1. These rails 70 and 72 are telescopically pluggable into mating slots 73 contained in the edge cover 28. The rails 70 and 72 may be formed of a material of high heat transfer characteristics. The rails 70 and 72 may contact and conduct heat from the covers 24 and 26 and the filler 30 to the heat transfer device 14.

The interior of the rails 70 and 72 may include a high efficiency heat transfer system such as the heat pipe 74. Each heat pipe 74 extends through the rail 70 or 72 and connects to a heat pipe portion 74a inside the heat transfer device 14. Thus, each heat pipe 74 may conduct heat through the pipe 74 from the interior of the housing 12 into the interior of the heat transfer device 14. For example, each heat pipe 74 may extend through the base portion 76 of the heat transfer device 14, shown in FIG. 3, and thereby distribute the heat to the various fins 22.

In use the user grasps the opposite side faces 43 of the heat transfer device 14 and the housing 12 and simply plugs the heat transfer device 14 into the housing 12. As shown in FIG. 1, this single movement causes the heat transfer device 14 to be latched to the housing 12 through the engagement of the leaf spring catches 42 with the knobs 48. At the same time, the rails 70 and 72 may be plugged into the slots 73 in the housing 12 to make conductive contact with the upper and lower covers 24 and 26 and the filler 30.

The user may then insert the PCMCIA card 10 into a slot 78 in the computer 17 by holding the face 43 of the heat transfer device 14 and conventionally sliding the card 10 into the slot 78 until it catches inside the computer and makes electrical connection to the connector 15.

When it is desired to remove the card, a conventional actuator (not shown) may be operated to release the card 10. The card may be conveniently removed from the computer by grasping the faces 43 of the heat transfer device 14 and pulling the card 10 out of the computer 17.

The user then may disengage the heat transfer device 14 from the housing 12. In the illustrated embodiment this may be achieved by pulling the housing 12 and heat transfer device 14 in opposite directions. This overcomes the connection between the leaf spring catches 42 and knobs 48 (as well as the frictional connection between the rails 70 and 72 and their slots 73).

Heat generated by the electrical components may be conducted to the upper and lower covers 24 and 26 and the filler 30. From the upper and lower covers 24 and 26 and filler 30 (which act as temporary heat sinks), heat may be conducted through the rails 70 and 72 to the heat transfer device 14. From the heat transfer device 14, heat is transferred to the surrounding environment by convection in an efficient fashion.

If heat pipes 74 are utilized, heat transferred through the rails 70 and 72 may be highly efficient. The fluid contained in the inner end 76 of each heat pipe 74 is heated. Heat is transferred to portions of the heat pipes which extend through the flat face 44 of the heat transfer device 14 for eventual heat transfer to the fins 22.

Thus efficient transfer of heat from the PCMCIA card to the exterior environment is possible without significant increase in cost. Moreover, the operation of the heat transfer device can facilitate the insertion and removal of the PCMCIA card. Therefore, the present invention provides an advantageous solution to the problem of removing heat from PCMCIA cards operated inside personal computers.

Figure 4:
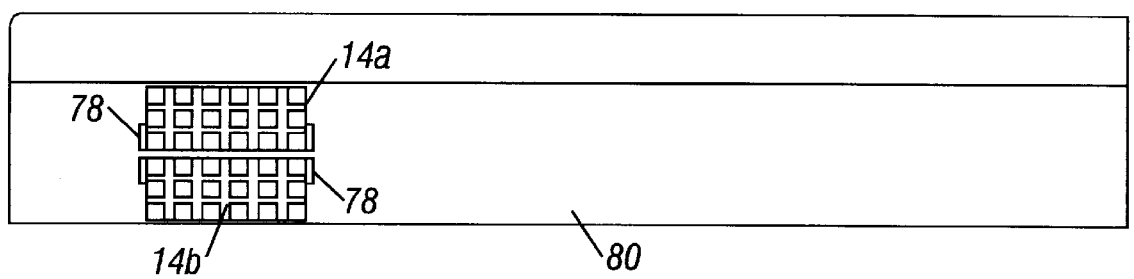
FIG. 4 is a side elevational view of a computer with two PCMCIA slots, each slot holding a PCMCIA card with a heat transfer device attached.

A computer 80 may include a pair of PCMCIA slots 78, one mounted above the other, as shown in FIG. 4. In such cases it is advantageous to have the heat transfer device 14 extend in only one direction. In the embodiment shown in FIG. 2, for example, only the portion 14a may be implemented so that, through the elimination of the portion 14b, no interference occurs with the card 10 in a lower slot 78. A card 10 in a lower slot 78 could then have only the heat transfer portion 14b so that neither of the heat transfer devices 14a or 14b interfere with the separate removal of the cards located in the slots 78.

The foregoing detailed description is by way of illustration and example only. The spirit and scope of the present invention is limited solely by the appended claims.

We claim:

1. A PCMCIA card pluggable into a personal computer, said card comprising:

a housing having an inner end insertable into said computer and an outer end opposite said inner end, said housing including upper and lower covers which are formed of metal of sufficient thickness such that said covers act as heat sinks;

a printed circuit board mounted in said housing for electrical connection to said computer;

a heat transfer device connectable to said outer end of said housing to transfer heat from said housing to the exterior of said card and the exterior of the computer; and said heat transfer device includes a pair of catches which releasably engage said housing and an electrical connector which pluggably connects to a connector contained inside said housing on one side of said heat transfer device and which pluggably connects to an electrical connector on the other side of said heat transfer device.

2. The card of claim 1 wherein said heat transfer device is arranged to extend transversely from said housing in only one direction so that two PCMCIA cards may be inserted into vertically spaced slots at the same time without interference between the heat transfer devices.

3. The card of claim 1 wherein said heat transfer device includes a member which extends outwardly away from said heat transfer device and is releasably pluggable into said housing to transfer heat from said housing to said heat transfer device.

4. The card of claim 3 wherein said member includes an internal heat pipe which extends through said member and through at least a portion of said heat transfer device.

5. The card of claim 1 wherein said catches are releasable so that said heat transfer device may be separated from said housing by pulling said heat transfer device away from said housing.

6. The card of claim 1 including a filler contained between said covers.

7. A computer system comprising:

a computer having a PCMCIA slot;

a PCMCIA card insertable into said PCMCIA slot for electrical connection to said computer, said card having a housing and a pair of opposed first and second ends, said first end being electrically connectable to said computer;

a heat transfer device located outside of said computer and being connectable to said second end of said card, said heat transfer device having a thickness substantially greater than the thickness of said slot, and said heat transfer device including a member which extends outwardly away from said heat transfer device and is releasably and telescopically pluggable into said housing through said second end to transfer heat from said housing through said member to said heat transfer device.

8. A PCMCIA card pluggable into a personal computer, said card comprising:

a housing having an inner end insertable into said computer and outer end opposite said inner end;

a printed circuit board mounted in said housing for electrical connection to said computer; and a heat transfer device connectable to said outer end of said housing to transfer heat from said housing to the exterior of said card and the exterior of said computer, and said heat transfer device having an opening to permit electrical connection through said heat transfer device, said heat transfer device includes an electrical connector in said opening, said connector pluggably connects to a connector contained inside said housing on one side of said heat transfer device and pluggably connects to an electrical connector on the other side of said heat transfer device.

* * * * *